Figure 1A:
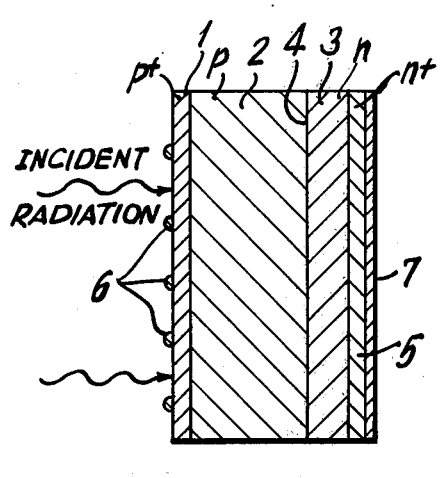

United States Patent [19]

Jain et al.

[11] 4,160,678
[45] Jul. 10, 1979

[54] HETEROJUNCTION SOLAR CELL

[76] Inventors: Faquir C. Jain, 16 Northwood Apartments, Stoors, Conn. 06268; Mahmoud A. Melehy, P.O. Box 409, R.F.D. #1, Baltic, Conn. 06330

[21] Appl. No.: 893,967

[22] Filed: Apr. 6, 1978

Related U.S. Application Data

[63] Continuation of Ser. No. 717,158, Aug. 24, 1976, abandoned, which is a continuation-in-part of Ser. No. 537,416, Dec. 30, 1974, abandoned.

[51] Int. Cl.$^2$ ............................................. H01L 31/06
[52] U.S. Cl. ........................... 136/89 SJ; 136/87 CR; 357/16; 357/30
[58] Field of Search ............. 136/89 SJ, 89 C, 89 SG; 357/16, 30; 250/211 J, 211 R

[56] References Cited

U.S. PATENT DOCUMENTS 3,081,370   3/1963   Miller .................................... 136/89

OTHER PUBLICATIONS

A. G. Milnes et al., "Heterojunctions & Metal-Semiconductor Junctions," Academic Press, (1972), p. 130.

*Primary Examiner*—Aaron Weisstuch
*Attorney, Agent, or Firm*—Hopgood, Calimafde, Kalil, Blaustein & Lieberman

[57] ABSTRACT

An improved efficiency heterojunction solar cell comprises a narrow-gap collector (or base) region and a wide-gap window region. The latter includes an inner and an outer region of the same conductivity type but of different impurity concentrations. The higher impurity concentration outer window region receives the incident light radiation. The impurity concentration in the inner window region is less than that in the inner collector region, with which it forms a p-n junction.

3 Claims, 2 Drawing Figures

HETEROJUNCTION SOLAR CELL

This is continuation of Ser. No. 717,158 filed Aug. 24, 1976, now abandoned, which was a continuation-in-part of Ser. No. 537,416, filed Dec. 30, 1974, now abandoned.

The present invention relates to an improved efficiency semiconductor solar cell.

The present energy crisis that has resulted from the increased cost and potential shortages of fossil fuels has focused attention on the urgent need for alternate sources of energy to generate electricity. Of the energy sources now in use for this purpose, only nuclear energy is generally considered as a possible alternative source of energy to fossil fuels; but the inherent risks to life and property involved in operating nuclear reactors, as well as in the disposal of the waste radioactive reactor material, is becoming increasingly clear. As a result, there are now serious questions being raised as to whether nuclear energy can be considered as a viable source of energy in the future.

For these and other reasons, the wind and the sun are now being seriously considered as possible sources of energy for use in driving electrical turbines and generators. Both of these potentially almost limitless energy sources, however, remain only in the experimental stages, despite the extensive study that has been given to their potential use since both, in their present state of development, are incapable of providing sufficient amounts of electrical energy at costs that are competitive with present sources of energy.

One device that is known to have the capability of transforming the sun's energy into electrical energy is a semiconductor solar cell. Planners have contemplated the arrangement of large arrays of solar cells, preferably in areas having a plentiful supply of sunlight, for generating electricity.

The conventional solar cell consists of a semiconductor wafer, which constitutes a single crystal, usually of silicon. The thickness of the silicon wafer is approximately in the range of about 200-500 microns. Such wafer includes a relatively narrow semiconductor window region of one conductivity type, on which the light energy is incident, formed on a relatively thick collector region of an opposite conductivity type and of a lower impurity concentration than the window region.

The term "impurity concentration" whenever used in this document signifies the number per unit volume of the donor, or acceptor (impurity) atoms in a semiconductor. If all the impurity atoms are ionized, as is the case usually at room temperature and above (and even down to $-50°$ C.) in an extrinsic semiconductor, the concentration of impurities (if there are only either donors or acceptor atoms) equals that of majority carriers (electrons or holes, respectively).

Electrodes are ohmically connected to the external surfaces of the window and collector regions. As presently understood, the incoming light energy passes through the window region and causes the formation of free electrons and holes in the cell. The movement of these free charge carriers through the cell produces an electrical current at the electrodes that can be fed to an external circuit. Solar cells of this type have been developed in both the homojunction and heterojunction forms.

One major disadvantage of the known solar cells, which is a principal factor standing in the way of their acceptance as a widely used source of electricity, is the relatively low efficiency of these devices, which is reflected in excessively high costs of generation. The best results that have been obtained with the known solar cells is about 15 percent of conversion of incident solar radiant energy to electrical energy. The reasons for the energy losses in conventional cells are believed to be the reflection of incident light from the surface of the window region, and the absorption of light in the window region which light cannot, therefore, be converted into electrical energy.

To minimize the former loss, the surface of the light-incident layer of the window region is usually covered with anti-reflection coating. Efforts at minimizing the latter source of energy loss have been primarily aimed at reducing the thickness of the window region in homojunction devices, or choosing a wide-gap material as the window region in heterojunction devices. The minimum thickness of the window region (e.g., about 0.2 micron), however, limits the amount of improvement that can be made by reducing the absorption herein.

It is also known that the maximum electrical power output of a solar cell is nearly proportional to the product of the open-circuit voltage $V_{oc}$, and the short-circuit current, $I_{sc}$. To improve the efficiency of the solar cell, it is necessary to increase $V_{oc}$ and/or the short-circuit current density $J_{sc}$. In silicon solar cells, it has heretofore been thought necessary to employ a high impurity concentration in the window region, in the typical range of: $1 \times 10^{19}/cm^3$ and $5 \times 10^{20}/cm^3$, and usually at or near the higher value.

This approach is followed for at least the following reasons: (1) a highly doped window region makes it possible to form a good ohmic contact with it; (2) the lower the resistivity of that region, the lower will be the sheet electrical resistance parallel to the surface and the less the ohmic losses will be in the window region; (3) with the common methods of fabrication, it is convenient to have the window region highly doped; and (4) according to the conventional theories, the doping level of the window region is not generally related to the efficiency and open-circuit voltage of the solar cell (see, for example, J. J. Leferski, Tenth 1973 IEEE Photovoltaic Specialists Conference, pp. 1-4, 1974). The usual approach in increasing solar cell efficiency has been to increase the doping level of the collector region (see, for example, M. Wolf, Energy Conversion, Vol. II, pp. 63-73, Pergamon Press, 1971). In addition, most of the efforts in developing an improved efficiency solar cell have been directed to homojunction cells utilizing silicon as the semiconductor material. The development of a heterojunction solar cell has thus far eluded the art.

It is, therefore, an object of the invention to provide a solar cell having significantly improved efficiency (and lower cost of operation) than that heretofore attained in solar cells.

It is a further object of the present invention to provide a heterojunction solar cell that is capable of producing higher output voltages and operating at higher efficiencies than have heretofore been attainable.

To these and other ends, the heterojunction solar cell of the invention includes a collector region of a narrow gap material of one conductivity type and a window region of a wide gap material and of an opposite conductivity type. The window region is formed of two overlying layers or regions of one conductivity type. The first of the two window regions-the one on which the light is incident–hereinafter called the outer window region, is of a relatively high impurity concentration. The other window region, hereinafter called the inner window region, is interior of the outer high-concentration region, and is of a relatively low impurity concentration. The impurity concentration in the inner window region is less than that in the collector (or base) region of the solar cell at the vicinity of the junction between the window and collector regions.

Figure 1B:
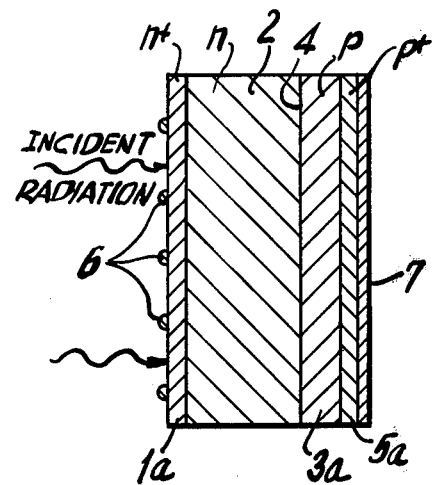

To the accomplishment of the above and to such further objects as may hereinafter appear, the present invention relates to a heterojunction solar cell, substantially as defined in the appended claims and as described in the following specification, taken together with the accompanying drawing in which:

FIGS. 1(A) and 1(B) are cross-sectional diagrams illustrating alternate heterojunction solar cells according to embodiments of the invention.

The heterojunction solar cell illustrated in FIG. 1(A) includes a window region formed of a wide-gap semiconductor material such as ZnSe, and a base or collector region of a narrow-gap semiconductor material, such as Ge. The window region consists of an outer window region 1 and an inner window region 2. The window regions 1 and 2 are the same conductivity type, shown as p-type in FIG. 1(A). The impurity concentration in the outer window region 1 is much higher than that of the inner window region. The outer window region may be formed by diffusion, epitaxial growth, or any other suitable method; the combined depth of the outer and inner window region is not critical—it may be between 1 and 500 microns-as long as the following conditions are met: (1) the window region should not absorb more than 15% of the incident radiation, and more preferably should not absorb more than 5% of the incident radiation; and (2) the axial ohmic resistance of that region should not cause unacceptably high ohmic losses. In the process of fabrication, therefore, the window region may be used as a substrate to grow on it a suitable crystal, which would act as the collector.

The base or collector region of the heterojunction cell is of an opposite conductivity type to that of the window region, and preferably consists of two regions, an inner collector region 3 and an outer collector region 4, the latter having a higher impurity concentration than the inner collector region. In FIG. 1(A) the inner n-type collector region 3 forms a (p-n) junction 4 at its interface with the inner window region 2.

An array of electrodes 6 is arranged in ohmic contact with the outer surface of the outer window region which receives the incident radiation, and accordingly should permit an optimum amount of light to be incident on that surface while still collecting the current produced by the solar cell. Another electrode 7 is arranged in ohmic contact with the outer surface of the outer collector region 5. The heterojunction solar cell illustrated in FIG. 1(B) is substantially the same as that illustrated in FIG. 1(A) except that the conductivity types of the window and collector regions are opposite to those shown in the embodiment of FIG. 1(A). That is, in the embodiment of FIG. 1(B), the window regions are of n-type conductivity whereas the collector regions are of p-type conductivity.

In one aspect of the invention, the impurity concentration of the inner window region 2 is less than that in the inner collector region 3. That is, the impurity concentration of the inner window region 2 may be between $5 \times 10^{15}/cm^3$ and $10^{17}/cm^3$. It is expected that the lower this concentration the higher will be the output voltage of the cell. However, lowering this impurity concentration also has the effect of increasing the axial resistivity of this region, thereby increasing the ohmic losses in the window region. The impurity concentration in the inner collector region 3 is between $10^{16}/cm^3$ and $10^{18}/cm^3$, depending in part on the impurity concentration in the inner window region 2. In all events, the impurity concentration in the inner collector region is at least twice that in the inner window region.

The impurity concentration of the outer window region is, as noted, considerably higher than that in the inner window region, and of a value at or above a level sufficient to establish a condition of degeneracy in the outer window region. For example, for ZnSe, the impurity concentration in the outer window region is in the range of $10^{18}/cm^3$ to $10^{21}/cm^3$, depending on the impurity solid solubility obtainable in the semiconductor forming the outer window region. A sufficiently high impurity concentration in the outer window region will make it possible to have a good ohmic contact between this region and the electrode and will further reduce, in the metal-semiconductor interface, the back emf which would otherwise decrease $V_{oc}$ and the cell efficiency. To this end, the impurity concentration in the outer collector region is relatively high, preferably in the range of $10^{19}/cm^3$ to $10^{21}/cm^3$, depending on the semiconductor material and the fabrication process. In each of the window and collector regions, the impurity concentrations are substantially uniform over the entire widths of the subregion. In the heterostructure, the outer and inner collector regions may merge together to form one region if the impurity concentration in the latter is sufficiently high to form a good ohmic contact, and the ohmic losses are sufficiently low.

In addition to the preferred impurity concentrations specified above for the heterojunction solar cell, the heterojunction solar cell of the invention is also preferably characterized by the following in order to achieve optimum efficiency of cell operation:

A. The percentage of transmission of solar energy through both window regions and through the hetero junction should be at least 70%, and preferably as high as 80 to 90% or higher. To help achieve this condition, the material of the window region is chosen to have a sufficiently wide energy gap. If the material selected does not meet the latter condition, then the thickness of the window region must be reduced sufficiently.

B. The absorption of solar energy in both collector regions should be at least 60%, and preferably about 70 to 90% or even higher, of the solar energy transmitted through the window region into the collector region, in which electron hole pairs are generated as the photons are absorbed.

C. The lifetime $\tau$ of minority carriers in the collector region under dark conditions should be 0.1 of 1% to 50% and preferably 50% to 80%, or even higher, of that found in the bulk of a crystal which is made of the same semiconductor as that of the inner collector region and which has the same impurity concentration and conductivity type as that of the inner collector region.

The preferred device dimensions can be chosen on the basis of specifications A and B. For example, for a ZnSe-Ge heterojunction solar cell, a ZnSe substrate, which constitutes the window region in the completed solar cell, may be advantageously between 100 and 400 microns in thickness. The absorption in this window region will be about 10% of the energy entering that region. If a Ge layer is grown on this substrate to form the collector or base region of the solar cell, a thickness of only 2-3 microns will absorb over 90% of the light transmitted through the ZnSe window region. A preferred process for the fabrication of a ZnSe-Ge heterojunction that can be utilized in this solar cell has been described in a Patent application entitled Heterojunction Devices, Ser. No. 434,707, filed by the present inventors on Jan. 18, 1974.

Based on the thermodynamic theory of generalized fields, expounded in a book entitled, "Foundations of the Thermodynamic Theory of Generalized Fields," authored by M. A. Melehy and published by MONO Book Corporation, 1973, a solar cell having the above-described specifications, as well as the preferred range of impurity concentrations specified for the window and collector regions, will operate at a substantially higher efficiency of converting solar energy into electrical energy than any such cells that have heretofore been developed and described.

From preliminary tests, it has been found that the solar cell of the invention achieves the conversion of incident light energy to electrical energy at an increased efficiency. As presently understood, the increased efficiency is, at least in part, brought about by the increase in the open circuit voltage $V_{oc}$ that is developed when the impurity concentration in the inner window region is relatively low in the range specified above, and with respect to higher impurity concentration in the inner base region.

The relatively high impurity concentration in the outer window region as specified also serves to improve the cell efficiency, as presently understood, at least in the following ways: (1) it creates an improved ohmic contact between the metallic electrode 6 and the outer window region; (2) it reduces the ohmic losses, that is, the resistance to current flow in the inner window region by causing the current to flow more axially—rather than parallel to the surface—through the inner window region; (3) it substantially reduces and practically eliminates the reverse or back photovoltaic emf that may be induced between the ohmic contact and window region of the conventional solar cell. This back emf has the effect of reducing $V_{oc}$ and consequently the solar cell output voltage and power; and (4) it causes the production of a small amount of additional electrical energy by the crossing of radiant energy across the isotype $p+-p$ (or $n+-n$) junction between the outer and inner window regions.

Although the heterojunction solar cell of the invention has been hereinabove specifically described as including a window region and a collector region each of which has two discrete regions of different impurity concentrations, it is also considered within the scope of the present invention to provide a window region and/or a collector region that includes a third or additional regions of different impurity concentrations. In such cases, the window regions will still be of the same conductivity type as will the collector regions.

It will thus be understood that modifications may be made to the embodiments of the solar cell of the invention as hereinabove specifically described, without necessarily departing from the spirit and scope of the invention.

What is claimed is:

1. A semiconductor solar cell comprising a window region of a semiconductor material of one conductivity type and having a given energy gap, a collector region of a different semiconductor material of a narrower energy gap and of an opposite conductivity type to said window region, said collector region forming a p-n heterojunction at its interface with said window region, the impurity concentration of an inner region of said window region adjacent to said heterojunction being less than half that of the portion of said collector region adjacent said heterojunction, said window region further including an outer window region spaced from said heterojunction and being of a greater conductivity than that of said inner window region.

2. The semiconductor cell of claim 1, in which the impurity concentration of said outer window region is sufficiently high to establish a condition of degeneracy in said outer window region.

3. The semiconductor cell of claim 1, in which the impurity concentration of said inner window region is substantially uniform and between $5 \times 10^{15}/cm^3$ and $10^{17}/cm^3$, and that in said portion of said collector region is between $10^{16}/cm^3$ and $10^{18}/cm^3$.

* * * * *